(12) United States Patent
Yasuda et al.

(10) Patent No.: US 7,427,818 B2
(45) Date of Patent: Sep. 23, 2008

(54) RELAXOR FERROELECTRIC SOLID-SOLUTION SINGLE CRYSTAL, DEVICE, AND METHOD OF USING DEVICE

(75) Inventors: Naohiko Yasuda, Mino (JP); Hidehiro Ohwa, Gifu (JP); Makoto Iwata, Nagoya (JP)

(73) Assignee: Gifu University (JP)

( * ) Notice: Subject to any disclaimer, the term of this patent is extended or adjusted under 35 U.S.C. 154(b) by 147 days.

(21) Appl. No.: 10/587,543

(22) PCT Filed: Jan. 28, 2005

(86) PCT No.: PCT/JP2005/001275

§ 371 (c)(1),
(2), (4) Date: Jul. 28, 2006

(87) PCT Pub. No.: WO2005/073788

PCT Pub. Date: Aug. 11, 2005

(65) Prior Publication Data

US 2007/0152182 A1    Jul. 5, 2007

(30) Foreign Application Priority Data

Jan. 30, 2004   (JP) .............................. 2004-023603

(51) Int. Cl.
*H01L 41/08* (2006.01)
(52) U.S. Cl. ...................................... 310/311; 310/317
(58) Field of Classification Search ......... 310/311–370, 310/800
See application file for complete search history.

(56) References Cited

U.S. PATENT DOCUMENTS

| | | | |
|---|---|---|---|
| 3,953,109 A * | 4/1976 | Kumada | 359/254 |
| 2002/0033993 A1* | 3/2002 | Furukawa et al. | 359/326 |
| 2002/0090517 A1* | 7/2002 | Zhang et al. | 428/421 |
| 2003/0113055 A1* | 6/2003 | Zhao et al. | 385/16 |

FOREIGN PATENT DOCUMENTS

| | | |
|---|---|---|
| JP | 2001-509312 | 7/2001 |
| JP | 2003-270602 A | 9/2003 |
| WO | 98/33220 | 7/1998 |

OTHER PUBLICATIONS

International Search Report of PCT/JP2005/001275, mailed May 17, 2005.

(Continued)

*Primary Examiner*—Thomas M Dougherty
(74) *Attorney, Agent, or Firm*—Nixon & Vanderhye PC

(57) ABSTRACT

A relaxor ferroelectric solid solution single crystal is capable of making transitions, at temperatures below the Curie temperature, between a first state which has a high permittivity and blocks optical transmission and a second state which has a low permittivity and allows optical transmission. The relaxor ferroelectric solid solution single crystal undergoes a transition to the second state if an electric field above a threshold is applied thereto in the first state. The relaxor ferroelectric solid solution single crystal undergoes a transition to the first state if heated to or above the Curie temperature in the second state.

7 Claims, 17 Drawing Sheets

OTHER PUBLICATIONS

Colla et al., "Dielectric properties of $(PMN)_{(1-x)}(PT)_x$ single crystals for various electrical and thermal histories", Journal of Applied Physics, vol. 83, No. 6, (1998), pp. 3298-3304.

Colla et al., "Dependence of dielectric relaxation on ac drive in $[Pb(Mg_{1/3}Nb_{2/3})O_3]_{(1-x)}$-$(PbTiO_3)$ single crystals", Journal of Applied Physics, vol. 85, No. 3, (1999), pp. 1693-1697.

Lu et al., Structural and electro-optic properties in lead magnesium niobate titanate thin films, Applied Physics Letters, vol. 74, No. 20, (1999), pp. 3038-3040.

Lu et al., Photoelastic effects in tetragonal $Pb(Zn_{1/3}Nb_{2/3})O_3$-$RbTiO_3$ single crystals near the morphotroptic phase boundary, Journal of Applied Physics, vol. 89, No. 9, (2001), pp. 5075-5078.

Kuwata et al., Phase transitions in the $Pb(Zn_{1/3}Nb_{2/3})O3$-$PbTiO_3$ system, Ferroelectrics, vol. 37, (1981), pp. 579-582.

Fujishiro et al., "Optical and structural studies of long-range order development in relaxor ferroelectrics", Journal of the Physical Society of Japan, vol. 69, No. 7, (2000), pp. 2331-2338.

Han et al., Electric field effects on the phase transitions in [001]-oriented $(1-x)Pb(Zn_{1/3}Nb_{2/3})O_3$-$xPbTiO_3$ single crystals with composition near the morphotropic phase boundary, Physical Review B, vol. 68, No. 13, (2003), pp. 134102.1 to 134102.6.

English translation of International Preliminary Report on Patentability of PCT/JP2005/001275, mailed Aug. 22, 2006.

* cited by examiner x=0.15        100μm x=0.20 x=0.28

<100>

100μm

<010>

E ⊗

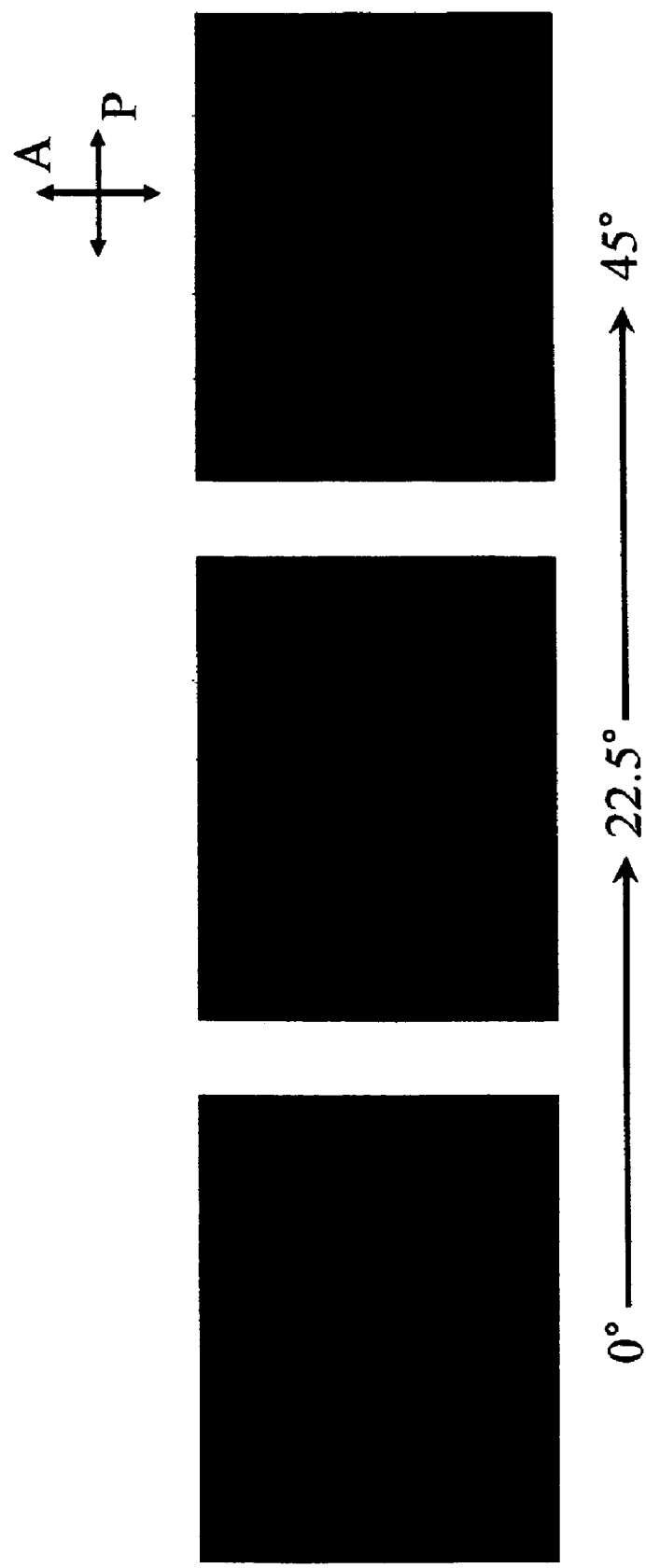

Fig. 17(b)
Fig. 17(a)
Fig. 17(d)
Fig. 17(c)

RELAXOR FERROELECTRIC SOLID-SOLUTION SINGLE CRYSTAL, DEVICE, AND METHOD OF USING DEVICE

This application is the U.S. national phase of international application PCT/JP2005/001275, filed 28 Jan. 2005, which designated the U.S. and claims priority of JP 2004-023603, filed 30 Jan. 2004, the entire contents of each of which are hereby incorporated by reference.

FIELD OF THE INVENTION

The present invention relates to relaxor ferroelectric substances which are useful in the field of optical mechatronics and applicable, for example, to information devices (IT devices) such as cell phones. Also, it relates to optical devices and ferroelectric devices which use such a relaxor ferroelectric substance as well as a method of using these devices.

BACKGROUND OF THE INVENTION

Relaxor ferroelectric substances have been used as capacitor materials because of their high permittivity as well as because of low temperature dependence and low electric-field dependence of their permittivity. Also, they have been used as piezoelectric/electrostrictive material to take full advantage of their excellent electromechanical coupling factor. Furthermore, their excellent piezoelectric characteristics have been used, for example, for ultrasonic transducers (e.g., Patent Document 1).

Patent Document 1: Japanese National Phase Laid-Open Patent Publication No. 2001-509312

SUMMARY OF THE INVENTION

The present invention is based on optical characteristics and dielectric characteristics of a relaxor ferroelectric solid solution single crystal newly found by the inventors and an objective of the present invention is to provide a relaxor ferroelectric solid solution single crystal which has unique optical characteristics and dielectric characteristics. Another objective of the present invention is to provide a device which uses the relaxor ferroelectric solid solution single crystal as well as to provide a method of using the device.

To achieve the above objectives, according to one aspect of the present invention, there is provided a relaxor ferroelectric solid solution single crystal. The relaxor ferroelectric solid solution single crystal is capable of making transitions, at temperatures below the Curie temperature, between a first state which has a high permittivity and blocks optical transmission and a second state which has a low permittivity and allows optical transmission. The relaxor ferroelectric solid solution single crystal undergoes a transition to the second state if an electric field above a threshold is applied in the first state.

Preferably, the relaxor ferroelectric solid solution single crystal undergoes a transition to the first state if heated to or above the Curie temperature in the second state. Then, the relaxor ferroelectric solid solution single crystal provided by the present invention will be capable of making transitions between the first state and second state reversibly.

The relaxor ferroelectric solid solution single crystal may be made of $(1-x)Pb(Mg_{1/3}Nb_{2/3})O_3 \cdot xPbTiO_3$, where x represents a composition ratio of $PbTiO_3$ in $(1-x)Pb(Mg_{1/3}Nb_{2/3})O_3 \cdot xPbTiO_3$. Hereinafter $(1-x)Pb(Mg_{1/3}Nb_{2/3})O_3 \cdot xPbTiO_3$ will be abbreviated to PMN-PT. The PMN-PT is capable of making transitions between the first state and second state within a range of the composition ratio x of between 0.1 and 0.2 (exclusive) by the application of an electric field.

Variations in characteristics of PMN-PT due to differences in the composition ratio x will be described below by citing PMN-PT. FIG. 2 is a graph showing temperature dependence of relative permittivity of approximately 100-µm-thick PMN-PT (001) plates which differ from each other in composition ratio x. The relative permittivity was measured by applying an AC electric field with a frequency of 10 kHz, 100 kHz, or 1 MHz to the PMN-PT (001) plates through electrodes attached to both sides of the PMN-PT (001) plates. The strength of the applied electric field was varied with the thickness of the measured plates, with the maximum electric field being 10 V/cm.

As can be seen from FIG. 2, the higher the frequency of the applied electric field, the lower the relative permittivity. It can also be seen from FIG. 2, that the relative permittivity is comparatively large when the composition ratio x is 0.1 or 0.2. The relative permittivity ($\epsilon_r$) is obtained by dividing permittivity ($\epsilon$) by the permittivity of vacuum ($\epsilon_0$) (i.e., $\epsilon_r = \epsilon/\epsilon_0$), and thus a substance with a high permittivity generally has a high relative permittivity. It should be noted in FIG. 2 that the relative permittivity exceeds 10,000 at a temperature of between 25° C. and 100° C. when x=0.1. It should also be noted that when x=0.2, the relative permittivity reaches a peak exceeding 10,000 at a temperature of 100° C. and lowers to approximately 5,000, less than half the peak, at a temperature of 50° C.

FIGS. 3(a) and 3(b) are phase diagrams of a PMN-PT solid solution single crystal, where FIG. 3(b) is a partial enlarged view of FIG. 3(a). In FIGS. 3(a) and 3(b), the abscissa represents the composition ratio x of $PbTiO_3$(PT) in the PMN-PT while the ordinate represents temperature. As shown in FIG. 3(a), the PMN-PT solid solution single crystal takes on any of a cubic phase, tetragonal phase, and pseudocubic/rhombohedral phase depending on the composition ratio and temperature. In FIGS. 3(a) and 3(b), a boundary between the tetragonal phase and cubic phase and a boundary between the pseudocubic/rhombohedral phase and cubic phase are represented by a boundary line α, and a boundary between the pseudocubic/rhombohedral phase and tetragonal phase is represented by an MPB (morphotropic phase boundary) line. When the composition ratio is constant, a crystal phase change occurs from a tetragonal phase or pseudocubic/rhombohedral phase to a cubic phase, or from a cubic phase to a tetragonal phase or pseudocubic/rhombohedral phase on reaching a certain temperature. The temperature at which the crystal phase change occurs is the Curie temperature.

The PMN-PT solid solution single crystal in the cubic phase has light blocking properties. That is, the PMN-PT solid solution single crystal blocks optical transmission regardless of its composition ratio x when its temperature is equal to or higher than the Curie temperature. On the other hand, when its temperature is below the Curie temperature, the PMN-PT solid solution single crystal allows optical transmission at least partially if its composition ratio x is 0.2 or higher.

The PMN-PT solid solution single crystal in the pseudocubic/rhombohedral phase exhibits electric field hysteresis when its composition ratio x is larger than 0.1 and smaller than 0.2 The PMN-PT solid solution single crystal with its composition ratio x being larger than 0.1 and smaller than 0.2 is capable of making transitions between a first state which has a high permittivity and blocks optical transmission and a second state which has a low permittivity and allows optical transmission. Also, the PMN-PT solid solution single crystal with its composition ratio x being larger than 0.1 and smaller than 0.2 has a memory effect. The memory effect consists in that at a temperature below the Curie temperature, once an electric field above a threshold is applied to the PMN-PT solid solution single crystal, even if the magnitude of the electric field is increased or decreased subsequently, the PMN-PT solid solution single crystal does not make a transition from the second state to the first state.

As shown in FIG. 3(b), when the composition ratio x is 0.1 or below, the Curie temperature becomes 40° C. or below, which is equal to or close to room temperature. When heated to or above the Curie temperature, the PMN-PT solid solution single crystal changes to a cubic phase in which it blocks optical transmission. Thus, when the Curie temperature is equal to or close to room temperature, even if the PMN-PT solid solution single crystal is caused by the application of an electric field above the threshold to make a transition to the state which has a low permittivity and allows optical transmission, it returns to the first state which blocks optical transmission, at a temperature equal to or close to room temperature. This hampers the memory effect. Thus, in order for the memory effect to be produced properly, it is preferable that the composition ratio x is larger than 0.1. In other words, in order for the memory effect to be produced properly, preferably the composition ratio x is set such that the Curie temperature will be higher than 40° C.

Preferably a lead-based complex perovskite compound of the relaxor ferroelectric solid solution single crystal is a pseudocubic/rhombohedral phase (001) plate. In the pseudocubic/rhombohedral phase (001) plate, an engineered domain structure called an oblique field prevents movement of domain walls caused by the application of an electric field. Consequently, the relaxor ferroelectric solid solution single crystal exhibits not only unique optical characteristics and ferroelectric characteristics, but also good actuator characteristics due to a high electromechanical coupling factor and good mechanical strain characteristics of the pseudocubic/rhombohedral phase (001) plate.

According to another aspect of the present invention, there is provided a device which uses the relaxor ferroelectric solid solution single crystal. Preferably the device uses at least optical characteristics of the relaxor ferroelectric solid solution single crystal. Alternatively, the device may use not only the optical characteristics, but also changes in dielectric characteristics of the relaxor ferroelectric solid solution single crystal taking place with changes in the optical characteristics.

According to still another aspect of the present invention, there is provided a method of using a device that incorporates the relaxor ferroelectric solid solution single crystal. The method includes: applying an electric field above a threshold to the relaxor ferroelectric solid solution single crystal in the device to cause the relaxor ferroelectric solid solution single crystal to make a transition from the first state to the second state; and heating the relaxor ferroelectric solid solution single crystal in the device to or above the Curie temperature to cause the relaxor ferroelectric solid solution single crystal to make a transition from the second state to the first state.

BRIEF DESCRIPTION OF THE DRAWINGS

FIGS. 11(a) to 11(c) are polarized photomicrographs taken of the device body in the optical device according to example 1 with no electric field being applied;

FIGS. 17(a) to 17(d) are polarized photomicrographs taken of the device body in the optical device according to example 2 by applying an electric field which changes unidirectionally from 0 kV/cm to 11.7 kV/cm and then unidirectionally from 11.7 kV/cm to 0 kV/cm.

DETAILED DESCRIPTION OF THE PREFERRED EMBODIMENTS

An embodiment of the present invention will be described below.

Figure 1:
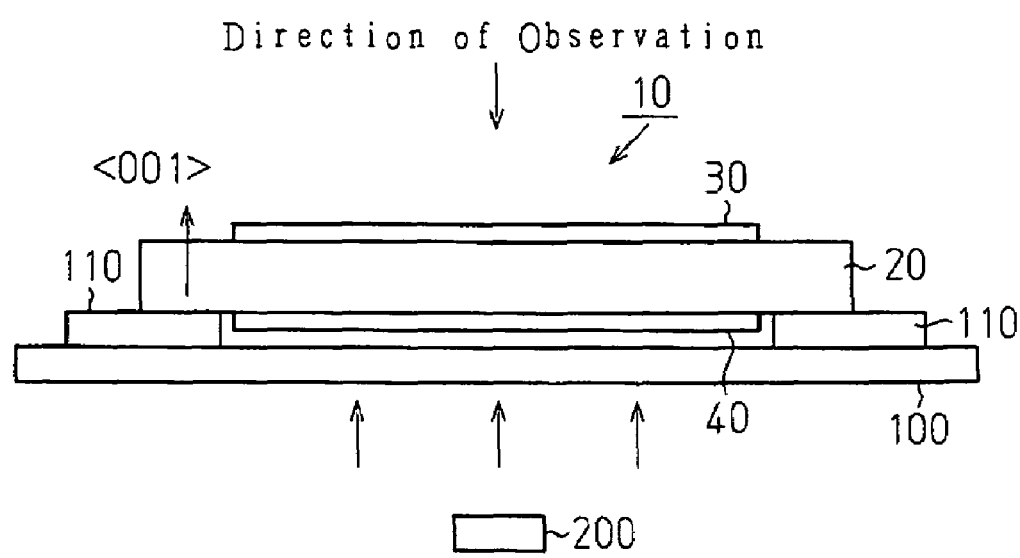
FIG. 1 is a side view of an optical device according to an embodiment of the present invention.
Figure 2:
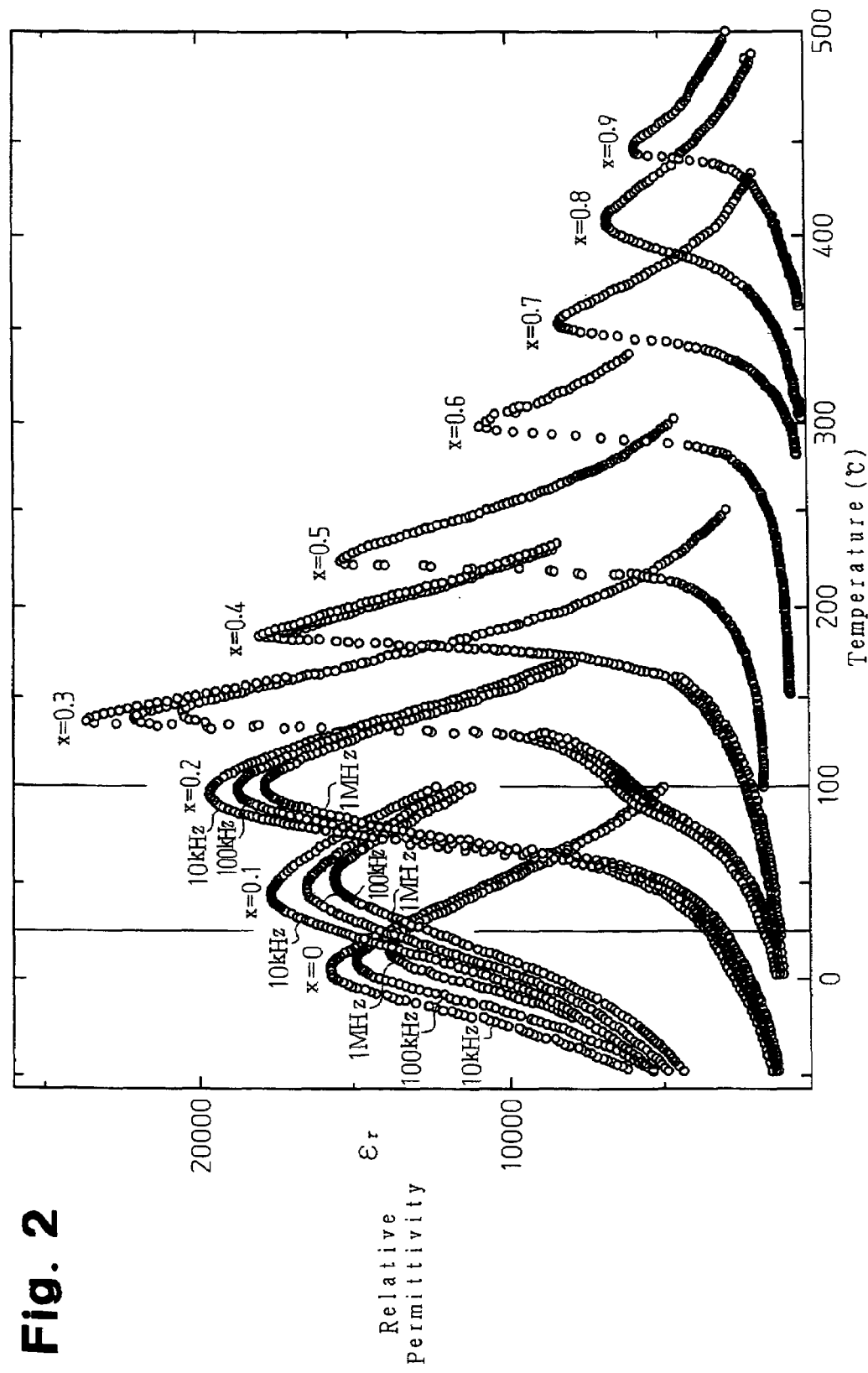
FIG. 2 is a graph showing temperature dependence of relative permittivity of PMN-PT (001) plates with composition ratio x of 0 to 0.9.

An optical device 10 according to the embodiment shown in FIG. 1 has a device body 20 and a pair of transparent electrodes 30 and 40. The device body 20 is a thin PMN-PT (001) plate. The number (001) in the PMN-PT (001) plate is an index of a crystal face. The transparent electrodes 30 and 40 are provided on both upper and lower faces of the device body 20. The transparent electrodes 30 and 40 are made of gold by a physical film forming process such as sputtering or vapor deposition.

Optical characteristics of the optical device 10 were observed under a polarizing microscope. More specifically, as shown in FIG. 1, the optical device 10 was placed on a transparent glass plate 100 in such a way as to sit astride a pair of glass supports 110 mounted atop the glass plate 100. Then, the optical device 10 was observed through crossed Nicol prisms under the polarizing microscope by illuminating the optical device 10 with polarized light from a light source 200 through the transparent glass plate 100 from below. Incidentally, the number <001> in FIG. 1 is an index of a zone axis.

The transparent electrodes 30 and 40 are connected to a DC power supply (not shown) via lead wires and variable resisters (not shown). Voltage of different values can be applied between the transparent electrodes 30 and 40. A switching circuit (not shown) is attached to the lead wires. A positive or negative voltage can be applied between the transparent electrodes 30 and 40 through operation of the switching circuit. The transparent electrodes 30 and 40 also function as electrodes for use to measure the permittivity of the device body 20 (PMN-PT). Besides, they are also used as capacitor output terminals when the optical device 10 is not only used as a device which utilizes the optical characteristics of the PMN-PT, but also used in the manner of an electronic circuit as a device which utilizes changes in the dielectric characteristics of the PMN-PT taking place with changes in the optical characteristics.

Examples and comparative examples of the present invention will be described below. Incidentally, observations and measurements were conducted at room temperature (25° C.) unless otherwise stated.

Optical devices according to examples 1 and 2 and comparative examples 1 to 4 were created using a 122-μm thick device body made of a PMN-PT (001) plate. The composition ratio x of $PbTiO_3$ in the PMN-PT was 0.15 in example 1, 0.13 in example 2, 0.2 in comparative example 1, 0.28 in comparative example 2, 0.1 in comparative example 3, and 0.06 in comparative example 4.

Figure 8:
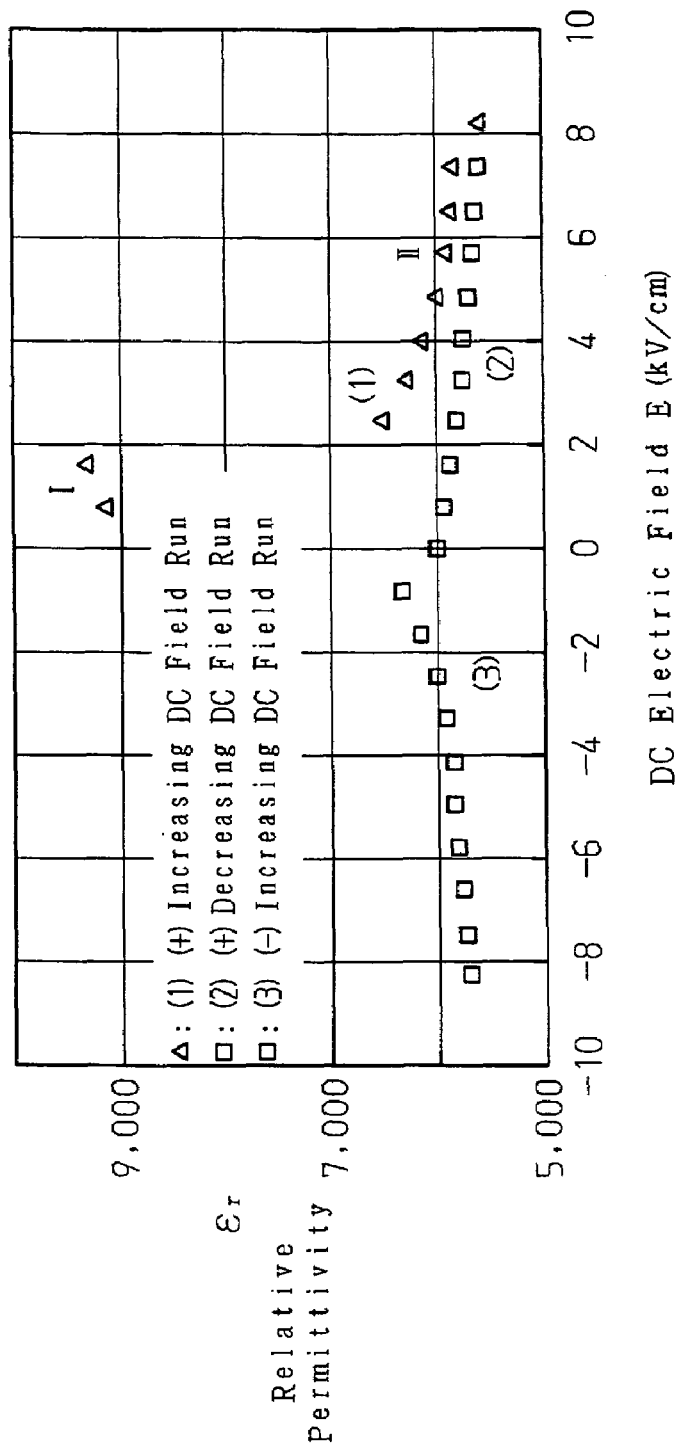
FIG. 8 is a graph showing electric-field dependence of relative permittivity of the optical device according to example 1.

FIG. 8 shows changes in the relative permittivity of the device body (PMN-PT) in the optical device according to example 1, measured by applying an electric field which changes unidirectionally from 0 kV/cm to 8.2 kV/cm and then unidirectionally from 8.2 kV/cm to −8.2 kV/cm. Incidentally, the PMN-PT in the device body before the application of the electric field was in a state in which it had a high permittivity and blocked optical transmission.

Figure 4A:
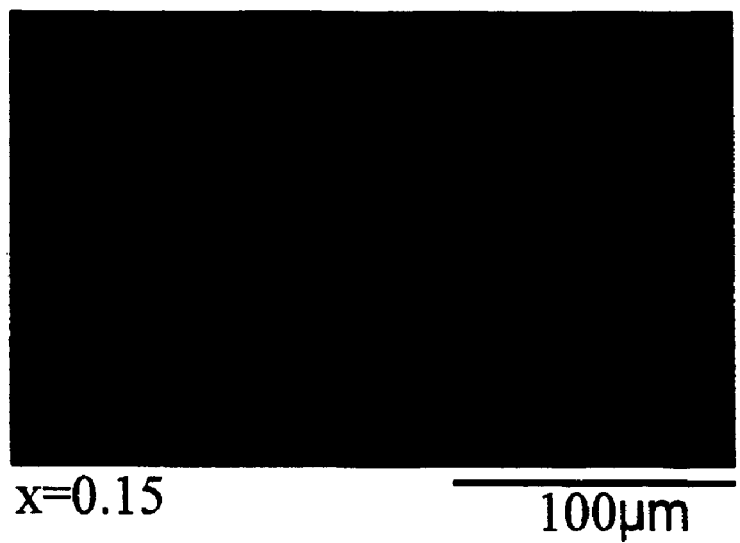
FIGS. 4(a) to 4(c) are polarized photomicrographs taken of device bodies of optical devices according to example 1 and comparative examples 1 and 2 with no electric field being applied.
Figure 4B:
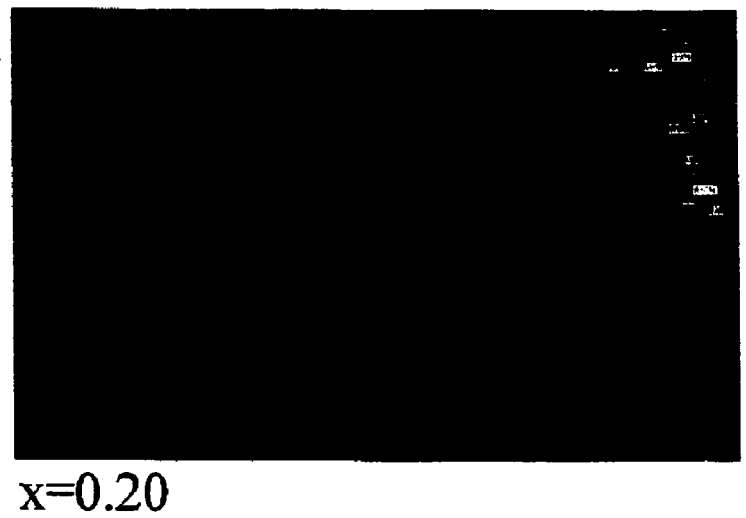
Figure 4C:
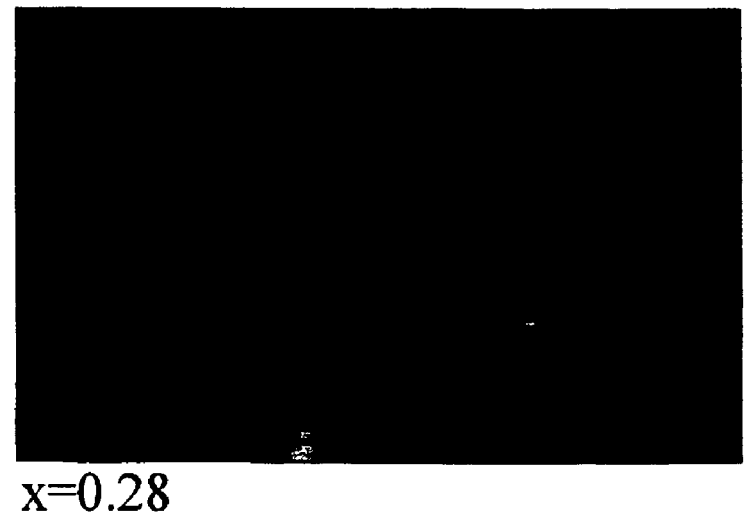

FIGS. 4(a) to 4(c) show results obtained by observing the device bodies of the optical devices according to example 1 and comparative examples 1 and 2 through crossed Nicol prisms under the polarizing microscope with no electric field being applied. FIG. 4(a) shows an observation result of the optical device 10 according to example 1, where optical transmission is blocked throughout the entire area. FIG. 4(b) shows an observation result of the optical device according to comparative example 1, where optical transmission is allowed partially. FIG. 4(c) shows an observation result of the optical device according to comparative example 2, where optical transmission is allowed throughout the entire area.

FIGS. 11(a) to 11(c) show results obtained by observing the device body of the optical device according to example 1 through crossed Nicol prisms under the polarizing microscope with no electric field being applied, as in the case of FIG. 4(a). However, FIG. 11(a) shows an observation result at a stage rotation angle of 0°, FIG. 11(b) shows an observation result at a stage rotation angle of 22.5°, and FIG. 11(c) shows an observation result at a stage rotation angle of 45°. As shown in FIGS. 11(a) to 11(c), dark-field image is observed at any of the rotation angles without any extinction position or diagonal position. The results indicate that the PMN-PT in the optical device according to example 1 blocks optical transmission when no electric field is applied.

Figure 12A:
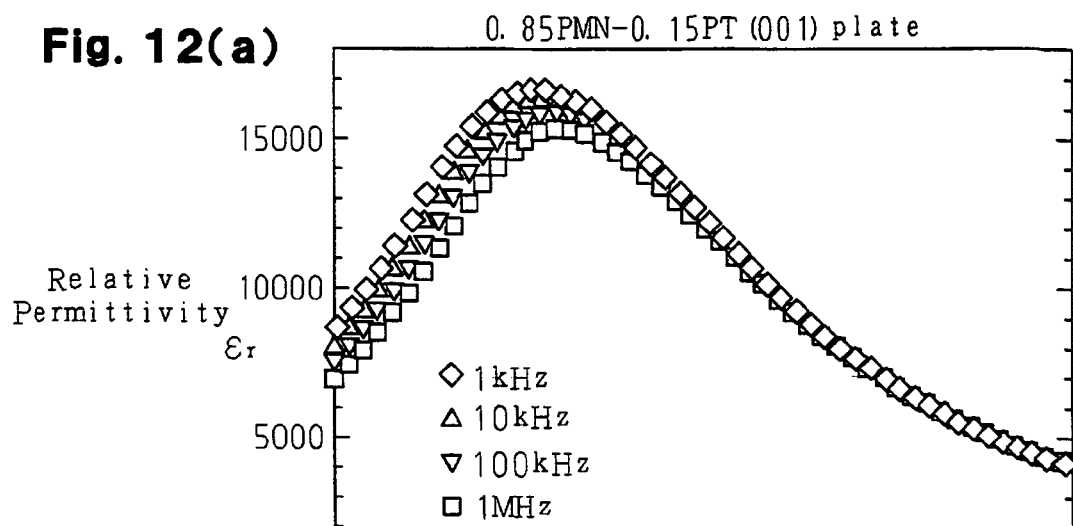
FIG. 12(a) is a graph showing temperature dependence of relative permittivity according to example 1.
Figure 12B:
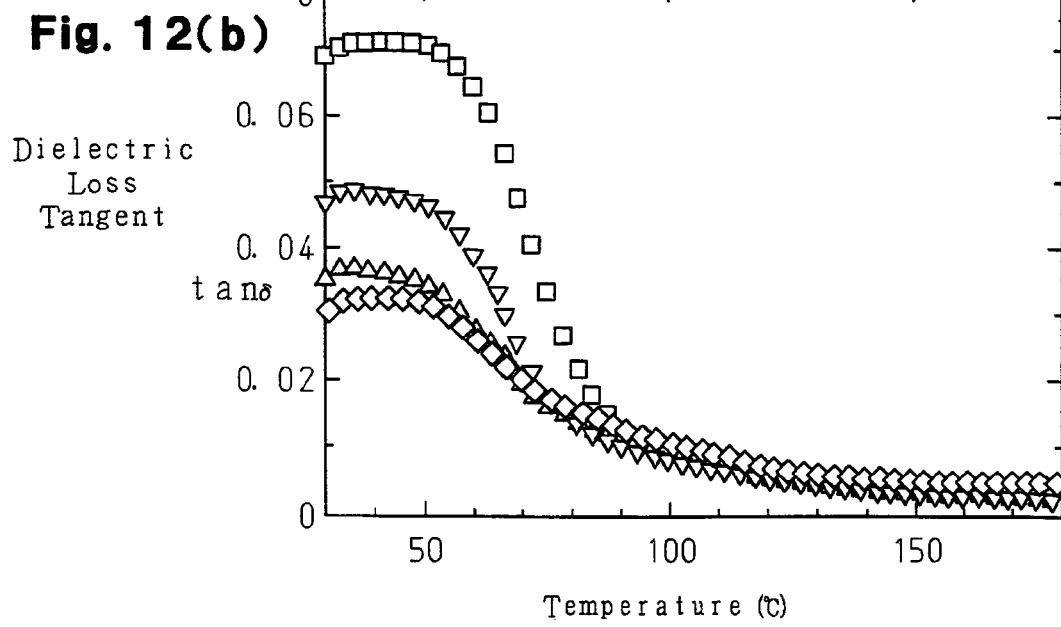
FIG. 12(b) is a graph showing temperature dependence of dielectric loss tangent according to example 1.

It is probably due to disorderly domain arrangement or small domain size that in FIGS. 11(a) to 11(c), the PMN-PT in the optical device according to example 1 does not allow optical transmission when no electric field is applied. In the optical device according to example 1, when no electric field is applied, the PMN-PT has a relative permittivity as high as around 9,500 (9,000 to 10,000), as shown in FIG. 8. At this time, the temperature dependence of relative permittivity and dielectric loss tangent of the PMN-PT shows a Vogel-Fulcher type dielectric dispersion peculiar to a relaxor as shown in FIGS. 12(a) and 12(b). The temperature dependence of relative permittivity and dielectric loss tangent was measured with an LCR meter by applying an AC electric field rather than a DC electric field to the PMN-PT. The strength of the applied electric field was 10 V/cm and the frequency used was 1 kHz, 10 kHz, 100 kHz, or 1 MHz.

The polarizing microscope observations described above and below employ a halogen light source with a wavelength range of 400 to 600 nm centered around 540 nm. In drawings which show results of the polarizing microscope observations, reference numeral A denotes an analyzer and P denotes a polarizer. Also, drawings which show results of polarizing microscope observations carried out by applying an electric field also contain a symbol which indicates the direction of application of the electric field. Under crossed Nicol prisms, the analyzer A and polarizer P are used by being arranged perpendicular to each other with a specimen placed between them. If the specimen is optically isotropic, the observation under the polarizing microscope results in a dark field. If the specimen is optically anisotropic, the observation results in a bright field. Generally, a ferroelectric specimen is an anisotropic body, but if the polarizer P is set in the direction of polarization, the observation results in a dark field. This phenomenon is known as extinction. The crystal phase of the PMN-PT in the optical device according to example 1 is a rhombohedral phase at room temperature (25° C.) and the polarization direction of the PMN-PT (001) plate in a rhombohedral phase coincides with a direction of <110>. Thus, a dark field appears at a position inclined at 45° from the x axis and a bright field appears at a position inclined at 60° or 30° from the x axis. The brightest position is known as a diagonal position. In a plate in a rhombohedral phase (001), the diagonal position appears on the x or y axis.

Figure 3A:
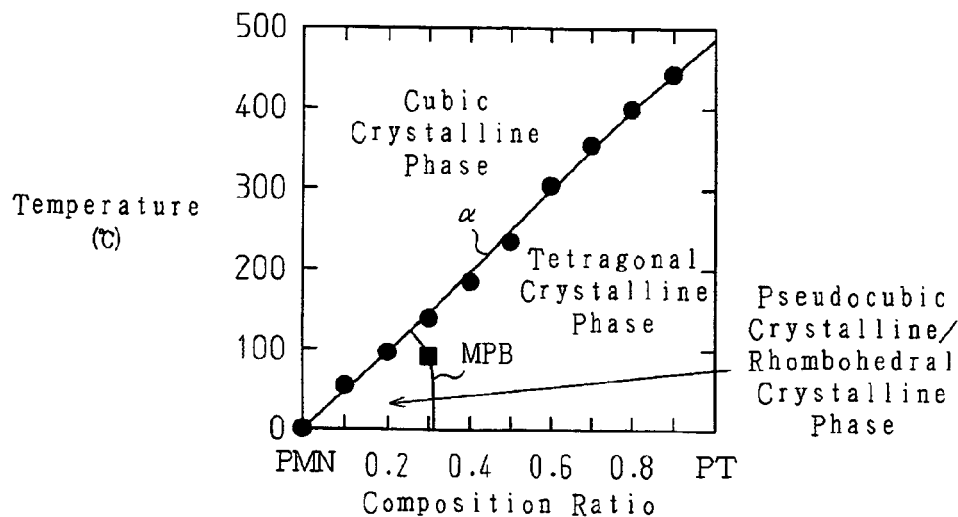
FIGS. 3(a) and 3(b) are phase diagrams of a PMN-PT solid solution single crystal.
Figure 3B:
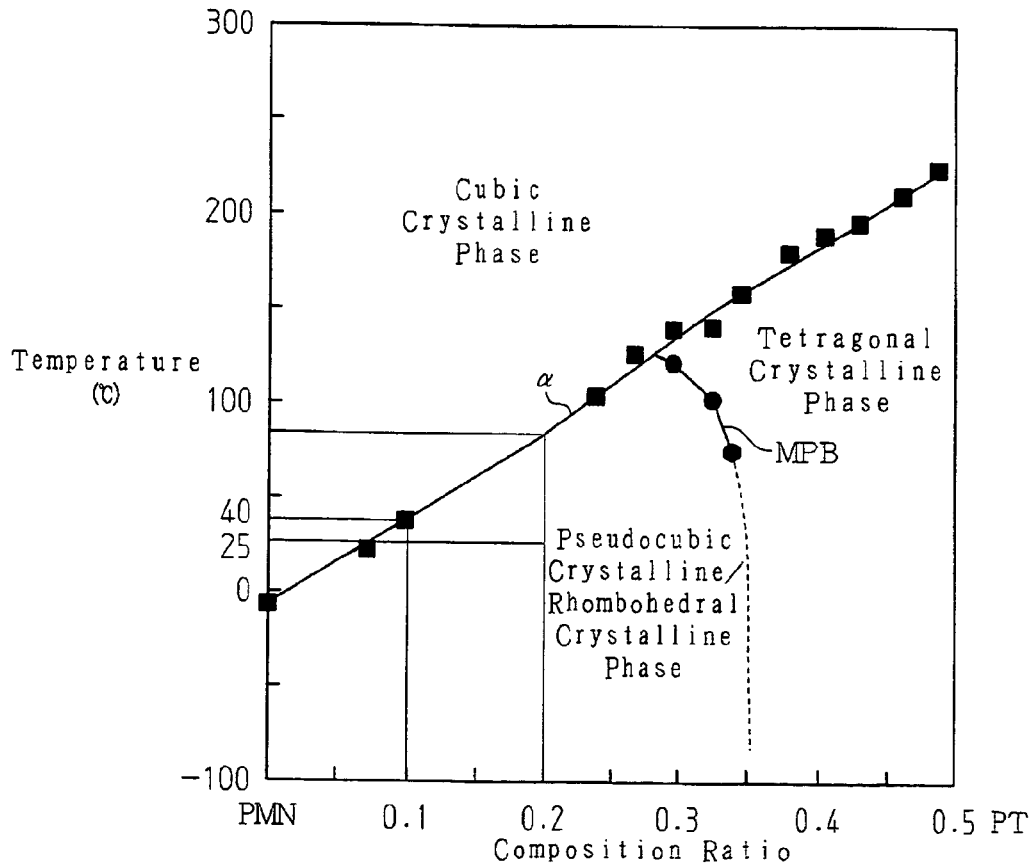

Incidentally, to obtain observation results shown in FIGS. 9 and 10 (described later), the analyzer A and polarizer P are placed at an angle of 60°. from a reference position to suit observation of the PMN-PT in a tetragonal phase. In the case of a PMN-PT(001) plate in a tetragonal phase, an extinction position appears on the x or y axis, and a bright-field image is observed between the x and y axes. When the composition ratio of $PbTiO_3$ in the PMN-PT is somewhat high, the crystal phase of the PMN-PT at ordinary temperature is the tetragonal phase rather than the rhombohedral phase as shown in FIG. 3(a). Also, when a very strong electric field is applied, the crystal phase of the PMN-PT changes from the rhombohedral phase to the tetragonal phase.

Figure 5A:
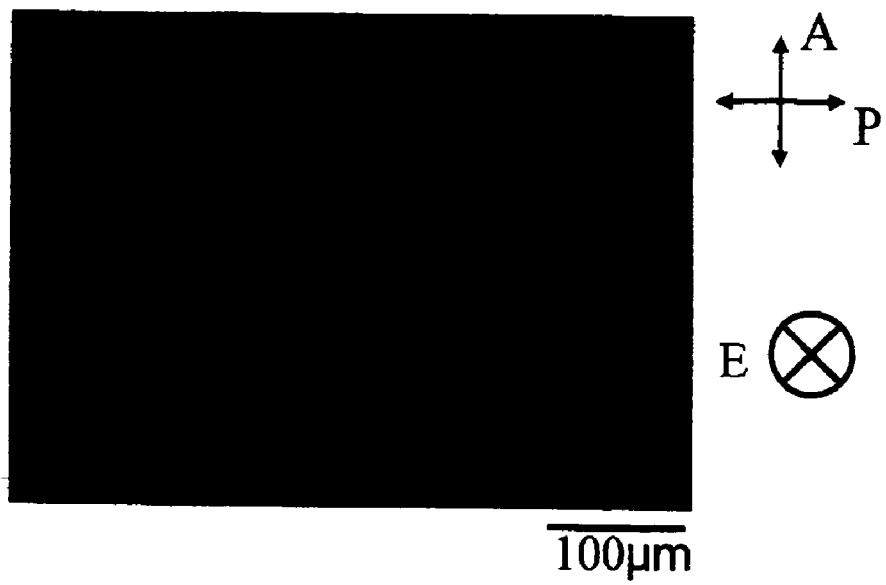
FIGS. 5(a) to 5(c) are polarized photomicrographs taken of a device body of an optical device according to comparative example 3.
Figure 5B:
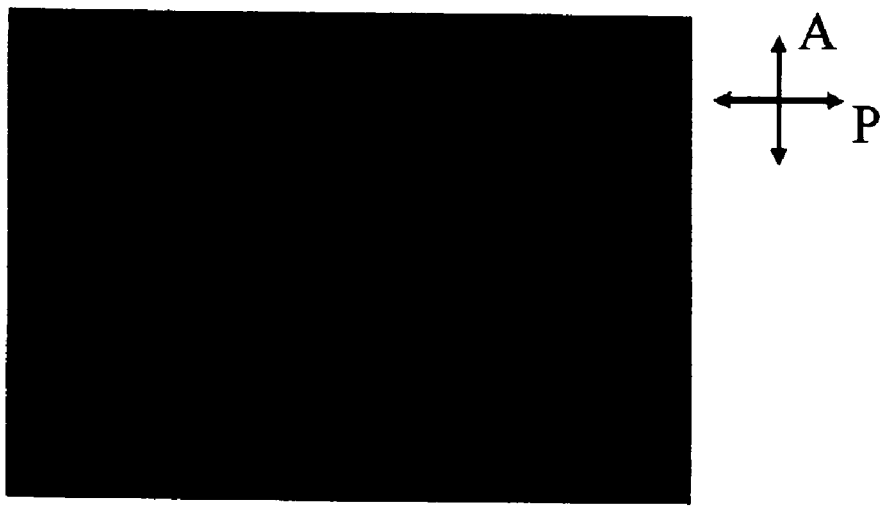
Figure 5C:
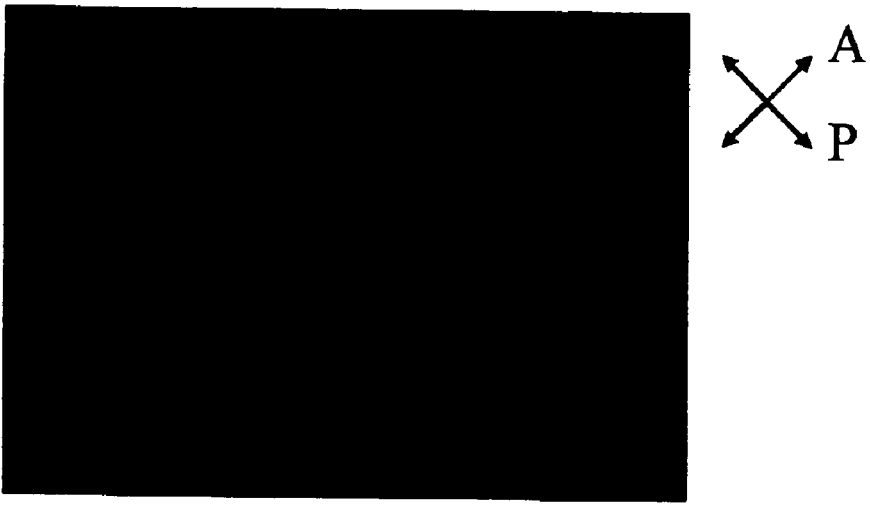

FIGS. 5(a) to 5(c) show results obtained by observing a device body of an optical device according to comparative example 3 through crossed Nicol prisms under the polarizing microscope. FIG. 5(a) shows an observation result obtained with no electric field applied, where optical transmission is blocked throughout the entire area. FIG. 5(b) shows an observation result obtained at a diagonal position with a 23 kV/cm electric field applied, where a bright-field image is observed.

FIG. 5(c) shows an observation result obtained at an extinction position with a 23 kV/cm electric field applied, where a dark-field image is observed.

Figure 6:
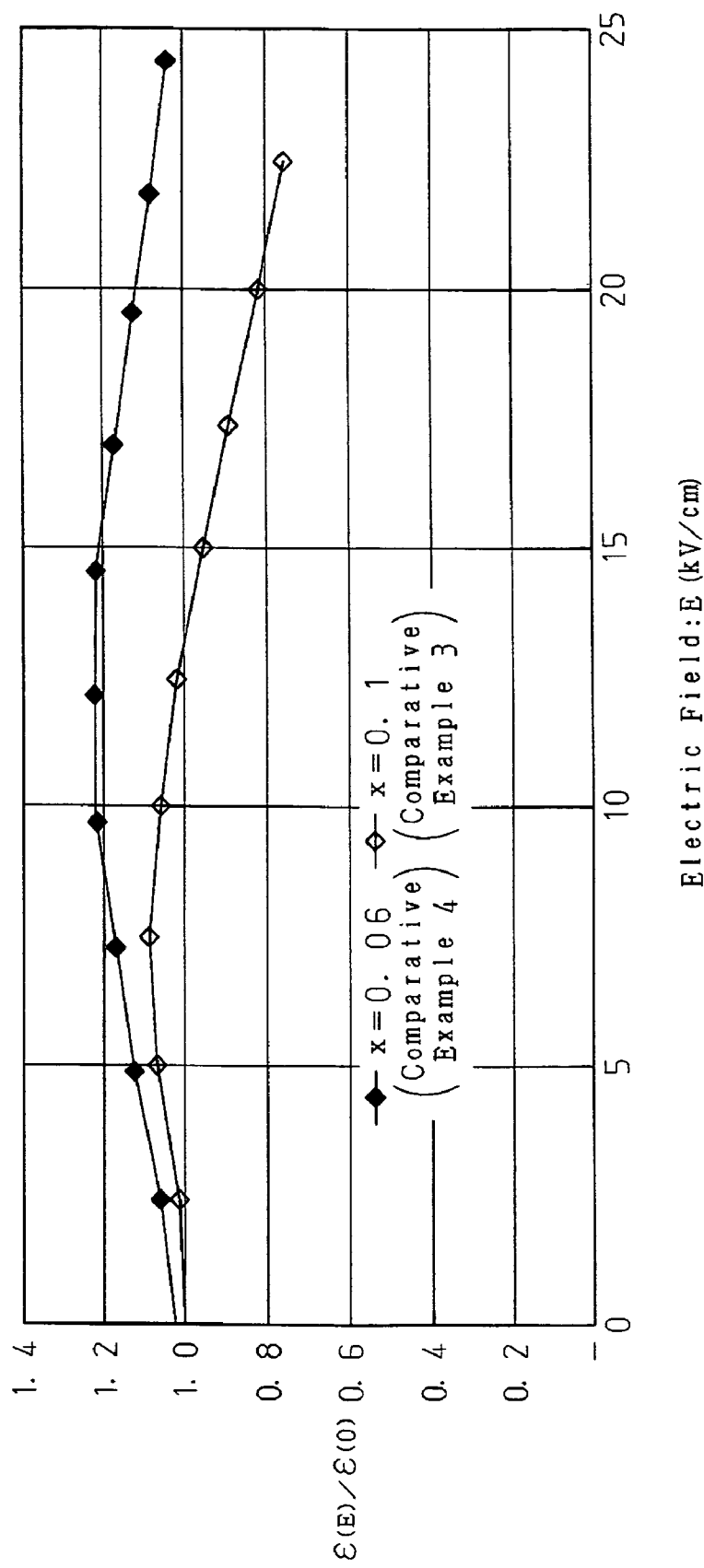
FIG. 6 is a graph showing electric-field dependence of $\epsilon_{(E)}/\epsilon_{(0)}$ of optical devices according to comparative examples 3 and 4.

FIG. 6 is a graph showing electric-field dependence (described later) of change in the permittivity of optical devices according to comparative examples 3 and 4. The change in the permittivity is represented by $\epsilon_{(E)}/\epsilon_{(0)}$ and obtained by dividing $\epsilon_{(E)}$ by $\epsilon_{(0)}$, where $\epsilon_{(0)}$ is the permittivity of the PMN-PT measured by applying a 10 V/cm AC electric field with a frequency of 1 MHz at room temperature (25° C.) and $\epsilon_{(E)}$ is the permittivity of the PMN-PT measured by applying a DC electric field E at room temperature (25° C.). In FIG. 6, the abscissa represents the strength of the DC electric field E applied to the PMN-PT while the ordinate represents $\epsilon_{(E)}/\epsilon_{(0)}$. As shown in FIG. 6, $\epsilon_{(E)}/\epsilon_{(0)}$ changes comparatively gently according to the strength of the applied electric field both in comparative examples 3 and 4.

It can be seen from the results shown in FIGS. 5(a) to 5(c) and FIG. 6 that the PMN-PT of the optical device according to comparative example 3 blocks optical transmission when no electric field is applied, and allows optical transmission when a 23 kV/cm electric field is applied. However, the PMN-PT of the optical devices according to comparative examples 3 and 4 do not exhibit electric field hysteresis.

Figure 7B:
FIGS. 7(a) to 7(d) are polarized photomicrographs taken of the device body in the optical device according to example 1 with an electric field which changes unidirectionally from 0 kV/cm to 8.2 kV/cm being applied to the optical device.
Figure 7D:
Figure 7A:
Figure 7C:

FIGS. 7(a) to 7(d) show results obtained by observing the device body of the optical device according to example 1 through crossed Nicol prisms under the polarizing microscope with an electric field which changes unidirectionally from 0 kV/cm to 8.2 kV/cm being applied to the optical device. FIG. 7(a) shows an observation result obtained with no electric field applied. FIG. 7(b) shows an observation result obtained by applying a 1.6 kV/cm electric field. FIG. 7(c) shows an observation result obtained by applying a 4.9 kV/cm electric field. FIG. 7(d) shows an observation result obtained by applying an 8.2 kV/cm electric field.

When an electric field above a threshold (2 kV/cm, in example 1) is applied, the PMN-PT in the device body makes a transition from a state in which it blocks optical transmission to a state in which it allows optical transmission as shown in FIGS. 7(c) and 7(d). At the same time, the relative permittivity of the PMN-PT is approximately halved to 6,000 (5,000 to 7,000) as shown in FIG. 8. Even if the applied electric field further increases in the positive direction, the optical transmission remains allowed and the relative permittivity remains low while decreasing gradually.

Figure 13:
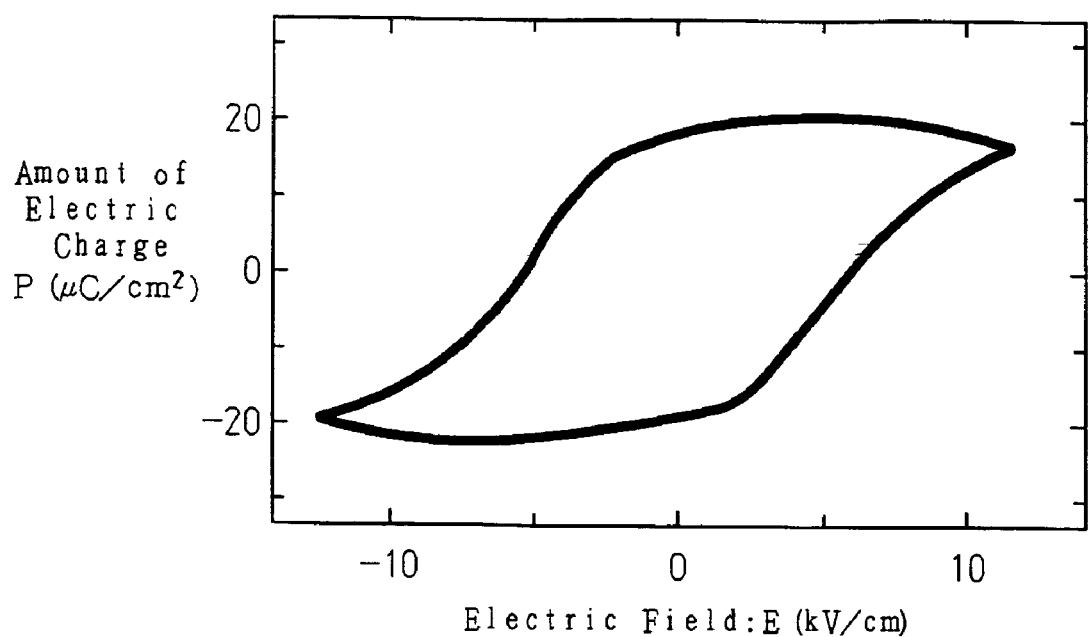
FIG. 13 is a polarization vs. electric field hysteresis curve according to example 1.

FIG. 13 is a polarization vs. electric field hysteresis curve of the PMN-PT in the optical device according to example 1. The polarization vs. electric field hysteresis curve was plotted in a 50-Hz AC electric field using a known Sawyer-Tower circuit. As can be seen from FIG. 13, the state which has a low permittivity and allows optical transmission is stored by memory effect. Thus, even if the strength of the applied electric field is increased or decreased, the state which has a low permittivity and allows optical transmission is maintained.

Figure 9B:
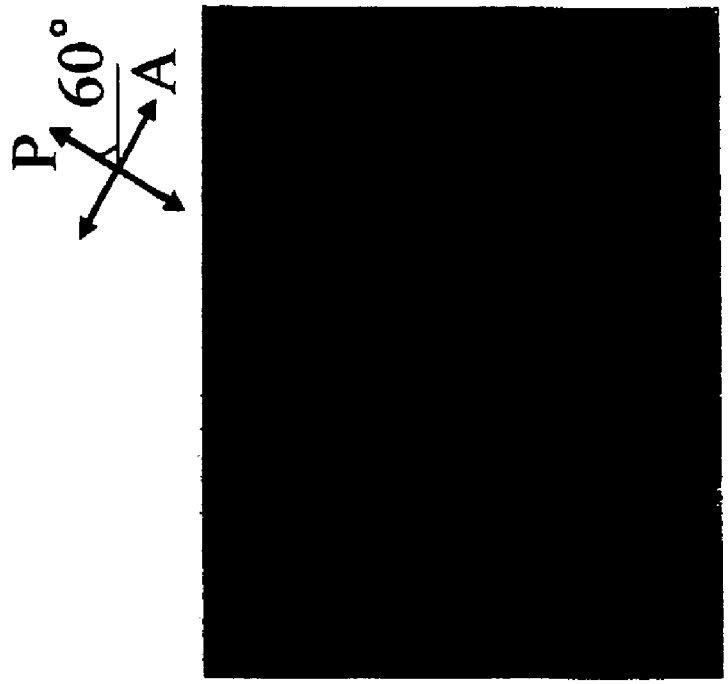
FIGS. 9(a) and 9(b) are polarized photomicrographs taken of the device body in the optical device according to example 1 with an electric field which changes unidirectionally from 8.2 kV/cm to 0 kV/cm being applied to the optical device.
Figure 9A:
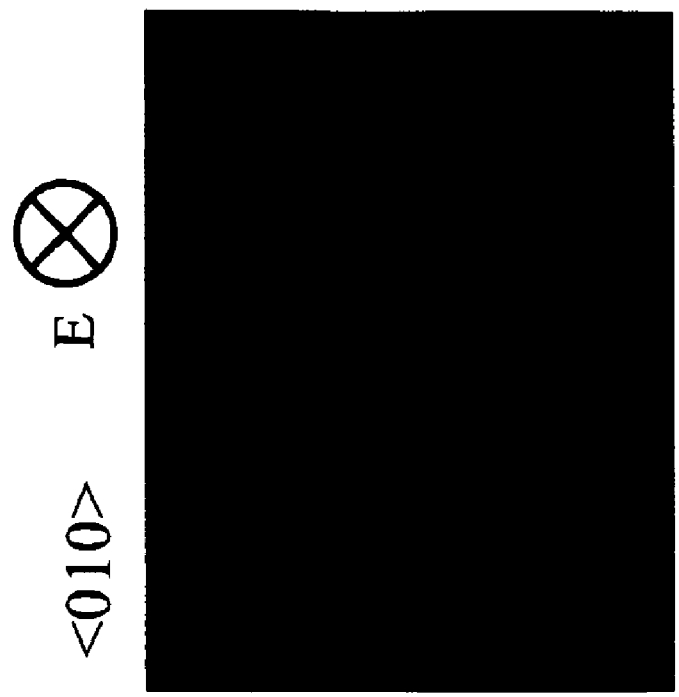

FIGS. 9(a) and 9(b) show results obtained by observing the device body of the optical device according to example 1 through crossed Nicol prisms under the polarizing microscope with an electric field which changes unidirectionally from 8.2 kV/cm to 0 kV/cm being applied to the optical device. FIG. 9(a) shows an observation result obtained by applying an 8.2 kV/cm electric field. FIG. 9(b) shows an observation result obtained with no electric field applied. When an electric field which changes unidirectionally from 8.2 kV/cm to 0 kV/cm is applied in this way, the optical transmission remains allowed as shown in FIGS. 9(a) and 9(b) with the permittivity kept low as shown in FIG. 8.

Figure 10A:
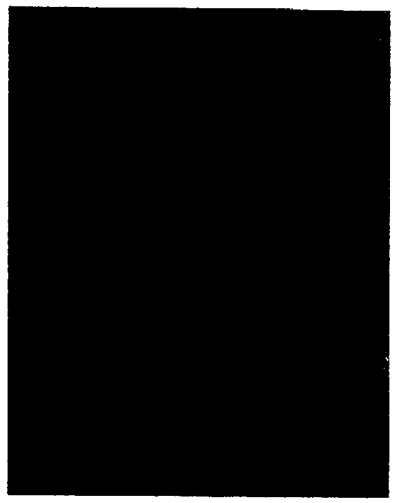
FIGS. 10(a) to 10(d) are polarized photomicrographs taken of the device body in the optical device according to example 1 with an electric field which changes unidirectionally from 0 kV/cm to −8.2 kV/cm being applied to, the optical device.
Figure 10B:
Figure 10C:
Figure 10D:

FIGS. 10(a) to 10(d) show results obtained by observing the device body of the optical device according to example 1 through crossed Nicol prisms under the polarizing microscope with an electric field which changes unidirectionally from 0 kV/cm to −8.2 kV/cm being applied to the optical device. FIG. 10(a) shows an observation result obtained with no electric field applied. FIG. 10(b) shows an observation result obtained by applying a −0.8 kV/cm electric field. FIG. 10(c) shows an observation result obtained by applying a −4.9 kV/cm electric field. FIG. 10(d) shows an observation result obtained by applying a −8.2 kV/cm electric field.

When an electric field which changes unidirectionally from 0 kV/cm to −8.2 kV/cm is applied in this way, a dielectric anomaly occurs when the electric field exceeds a predetermined dielectric anomaly threshold (−0.8 kV/cm, in example 1), resulting in a polarization switching. The domain structure of the PMN-PT changes accordingly. The dielectric anomaly caused by an electric field of −0.8 kV/cm can be observed from the graph in FIG. 8. When the applied electric field further increases in the negative direction, the optical transmission remains allowed and the relative permittivity remains low while decreasing gradually.

In this way, even if the strength of the applied electric field is increased or decreased, the state which has a low permittivity and allows optical transmission is maintained. In order for the PMN-PT to make a transition from the state which has a low permittivity and allows optical transmission to the initial state which has a high permittivity and blocks optical transmission, it is necessary to heat the device body to or above the Curie temperature.

Figure 14:
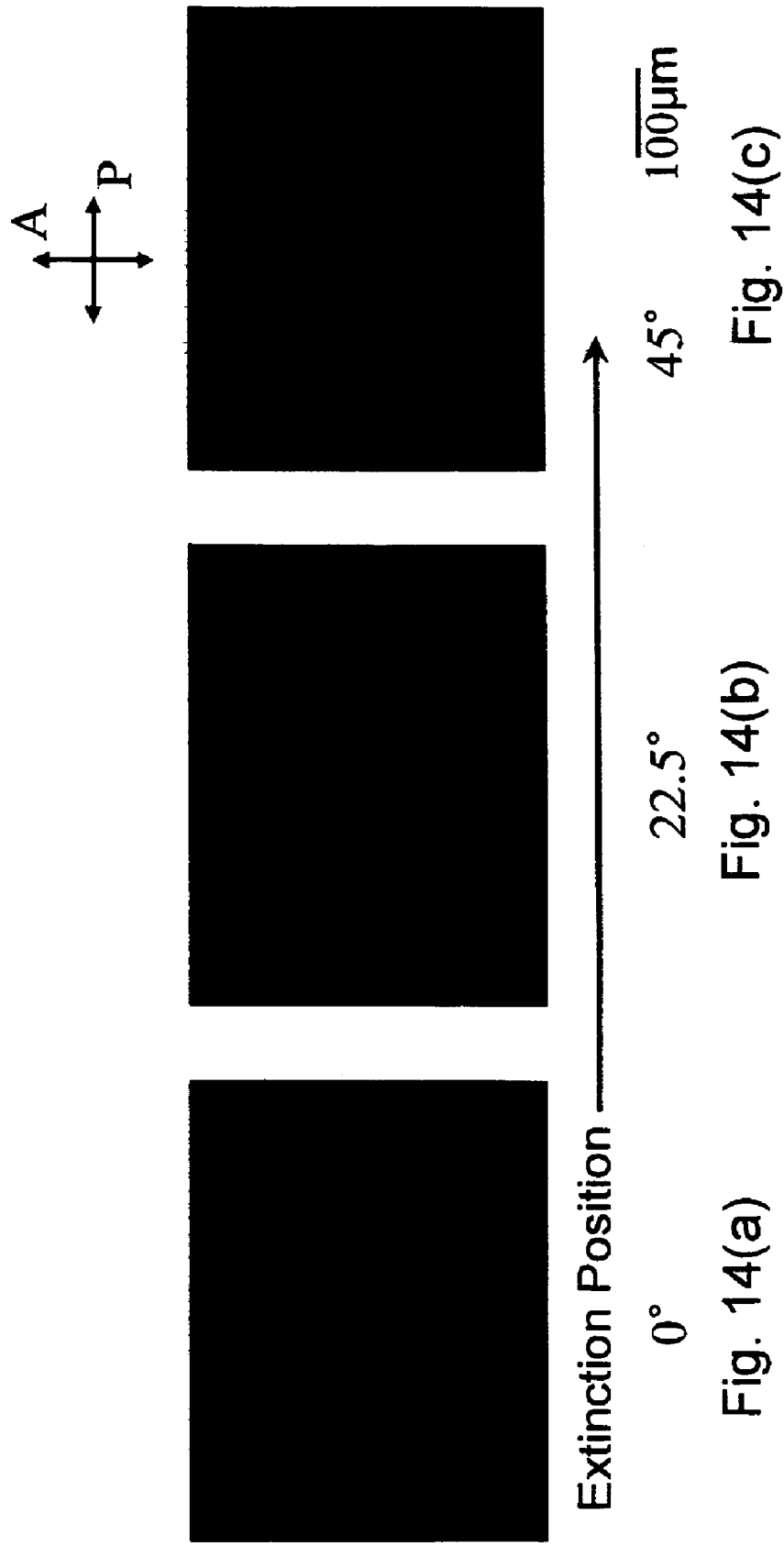
FIGS. 14(a) to 14(c) are polarized photomicrographs taken of the device body in the optical device according to example 1 with no electric field being applied after the optical device is heated to or above the Curie temperature.

FIGS. 14(a) to 14(c) show results obtained by observing the device body of the optical device according to example 1 through crossed Nicol prisms under the polarizing microscope with no electric field being applied after the optical device is heated to or above the Curie temperature. FIG. 14(a) shows an observation result obtained at an extinction position, FIG. 14(b) shows an observation result at a stage rotation angle of 22.5°, and FIG. 14(c) shows an observation result at a stage rotation angle of 45°. As shown in FIGS. 14(a) to 14(c), a dark-field image is observed at any of the rotation angles. This shows that after being heated to or above the Curie temperature, the PMN-PT is in a state in which it blocks optical transmission.

Figure 15:
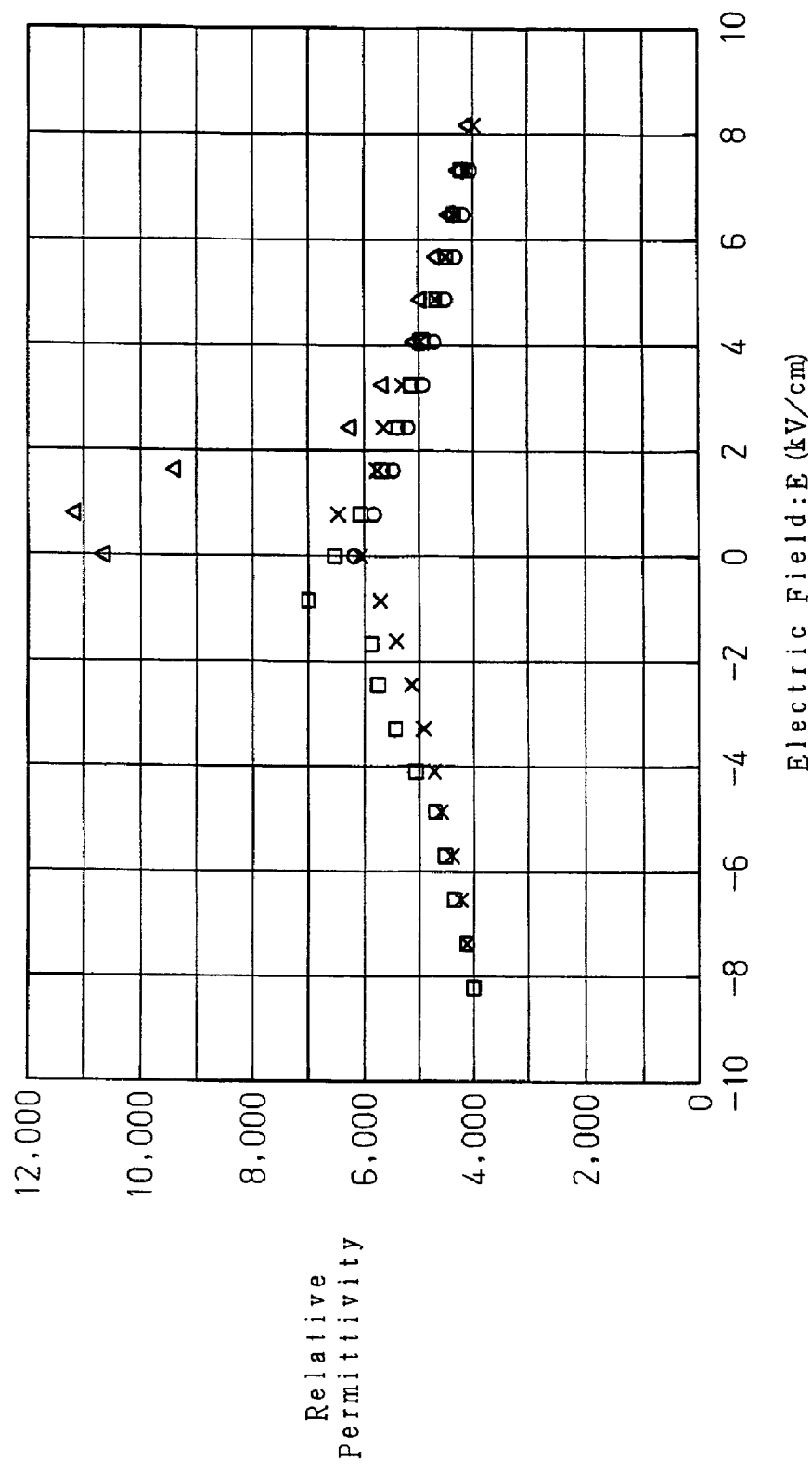
FIG. 15 is a graph showing electric-field dependence of relative permittivity of the optical device according to example 1 after the optical device is heated to or above the Curie temperature.

FIG. 15 is a graph showing electric-field dependence of relative permittivity of the optical device according to example 1 after the optical device is heated to or above the Curie temperature. In FIG. 15, symbol Δ indicates points at which measurements are taken by varying an electric field in the positive direction starting from zero. Symbol □ indicates points at which measurements are taken subsequently by varying the electric field unidirectionally from positive to negative. Symbol × indicates points at which measurements are taken subsequently by varying the electric field unidirectionally from negative to positive. Symbol ○ indicates points at which measurements are taken subsequently by varying the electric field unidirectionally from positive to zero. As shown in FIG. 15, after being heated to or above the Curie temperature, the PMN-PT has a relative permittivity as high as around 10,000 (9,000 to 12,000). However, when an electric field above the threshold is applied, the relative permittivity of the PMN-PT is approximately halved to 5,000 (4,000 to 7,000) by being reduced greatly. Once an electric field above the threshold is applied, the permittivity is kept low even if the electric field is varied from positive to negative or from negative to positive.

Figure 16:
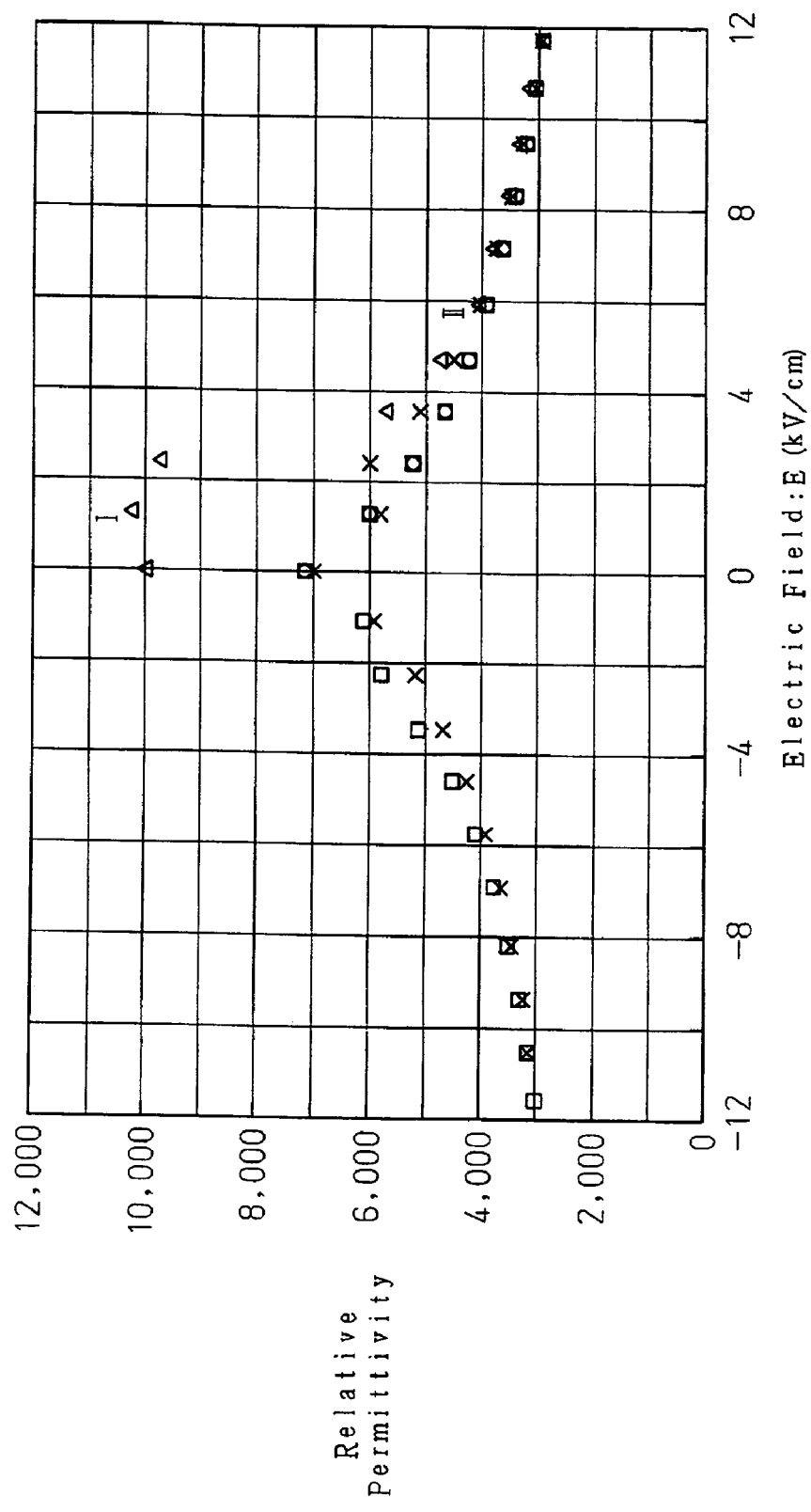
FIG. 16 is a graph showing electric-field dependence of relative permittivity of the optical device according to example 2.

FIG. 16 is a graph showing electric-field dependence of relative permittivity of the optical device according to example 2. In FIG. 16, symbol Δ indicates points at which measurements are taken by varying an electric field in the positive direction starting from zero. Symbol □ indicates points at which measurements are taken subsequently by varying the electric field unidirectionally from positive to negative. Symbol × indicates points at which measurements are taken subsequently by varying the electric field unidirectionally from negative to positive. Symbol ○ indicates points at which measurements are taken subsequently by varying the electric field unidirectionally from positive to zero. As shown in FIG. 16, after being heated to or above the Curie temperature, the PMN-PT has a relative permittivity as high as around 10,000 (9,000 to 12,000). However, when an electric field above the threshold is applied, the relative permittivity of the PMN-PT is approximately halved to 5,000 (3,000 to 7,000) by being reduced greatly. Again, with the optical device according to example 2, as in the case of the optical device according to example 1, once an electric field above the threshold is applied, the permittivity is kept low even if the electric field is varied from positive to negative or from negative to positive.

The device body of the optical device according to example 2 was observed through crossed Nicol prisms under the polarizing microscope with no electric field being applied. Although not shown, it was confirmed that in the optical device according to example 2, the PMN-PT was in a state in which it blocked optical transmission.

FIGS. 17(a) to 17(d) show results obtained by observing the device body of the optical device according to example 2 through crossed Nicol prisms under the polarizing microscope by applying an electric field which changes unidirectionally from 0 kV/cm to 11.7 kV/cm and then unidirectionally from 11.7 kV/cm to 0 kV/cm. FIG. 17(a) shows an observation result obtained with no electric field applied. FIG. 17(b) shows an observation result obtained by applying a 7.0 kV/cm electric field. FIG. 17(c) shows an observation result obtained by applying an 11.7 kV/cm electric field. FIG. 17(d) shows an observation result obtained with no electric field applied after an 11.7 kV/cm electric field is applied once.

When an electric field above a threshold (3 kV/cm, in example 2) is applied, the PMN-PT in the device body makes a transition from a state in which it blocks optical transmission to a state in which it allows optical transmission as shown in FIGS. 17(b) to 17(d). At the same time, the PMN-PT exhibits a low relative permittivity (permittivity) as shown in FIG. 16. Even if the applied electric field further increases in the positive direction, the optical transmission remains allowed and the relative permittivity remains low while decreasing gradually.

When an electric field which changes unidirectionally from 11.7 kV/cm to 0 kV/cm is applied to the optical device according to example 2, the relative permittivity is kept at as low as approximately 7,000 as shown in FIG. 16. At the same time, the optical transmission remains allowed as shown in FIG. 17(d).

The threshold at which the PMN-PT makes a transition from a state which has a high permittivity and blocks optical transmission to a state which has a low permittivity and allows optical transmission varies between examples 1 and 2: 2 kV/cm in example 1 and 3 kV/cm in example 2. Generally, the threshold increases with decreases in the composition ratio of $PbTiO_3$ in the PMN-PT.

The embodiment described above may be changed as follows.

The optical device 10 may be embodied as an optical memory. In that case, the optical memory stores information as a binary signal of a state which allows optical transmission or a state which blocks optical transmission. The device body 20 exhibits a low permittivity when it is in a state in which it allows optical transmission, and a high permittivity when it is in a state in which it blocks optical transmission. Consequently, by detecting differences in the permittivity as voltage changes, it is possible to read stored contents easily.

Conventional techniques which use light to store information include a magneto-optical disk. The magneto-optical disk stores information as a binary signal in a specific area on the medium by irradiating the specific area with a laser beam, thereby heating the irradiated specific area to or above the Curie temperature, and then applying an external magnetic field when coercivity of the specific area lowers, thereby magnetizing the specific area upward or downward. In this way, with the magneto-optical disk, the magnetic field must be applied upward or downward distinctively after heating the specific area to or above the Curie temperature by irradiating it with a laser beam. On the other hand, if the optical device 10 is embodied as an optical memory, it is possible to switch between a state (ON) which allows optical transmission through a specific area and a state (OFF) which blocks optical transmission, depending on whether or not the optical device 10 is heated to or above the Curie temperature.

The optical device 10 may be embodied as a light valve. In that case, the light valve controls entering light and outgoing light by switching between a state which allows optical transmission and a state which blocks optical transmission. The device body 20 exhibits a low permittivity when it is in a state in which it allows optical transmission, and a high permittivity when it is in a state in which it blocks optical transmission. Consequently, by detecting differences in the permittivity as voltage changes, it is possible to detect operation of the light valve.

The optical device 10 may be used as an actuator which utilizes piezoelectric characteristics of PMN-PT in addition to the optical characteristics and dielectric characteristics of the PMN-PT.

The invention claimed is:

1. A device that uses a relaxor ferroelectric solid solution single crystal, wherein the relaxor ferroelectric solid solution single crystal is capable of making transitions, at temperatures below the Curie temperature, between a first state which has a high permittivity and blocks optical transmission and a second state which has a low permittivity and allows optical transmission, and the relaxor ferroelectric solid solution single crystal undergoes a transition to the second state if an electric field above a threshold is applied in the first state and undergoes a transition to the first state if heated to or above the Curie temperature in the second state, the device comprising:
   a unit that applies an electric field above a threshold to the relaxor ferroelectric solid solution single crystal in the device to cause the relaxor ferroelectric solid solution single crystal to make a transition from the first state to the second state; and
   a unit that heats the relaxor ferroelectric solid solution single crystal in the device to or above the Curie temperature to cause the relaxor ferroelectric solid solution single crystal to make a transition from the second state to the first state.

2. The device according to claim 1, wherein the relative permittivity of the relaxor ferroelectric solid solution single crystal in the device is 9,000 or above in the first state, and 7,000 or below in the second state.

3. The device according to claim 1, wherein the relative permittivity of the relaxor ferroelectric solid solution single crystal in the device is approximately halved when the relaxor ferroelectric solid solution single crystal makes a transition from the first state to the second state.

4. The device according to claim 1, wherein the relaxor ferroelectric solid solution single crystal in the device is a pseudocubic rhombohedral phase (001) plate.

5. The device according to claim 1, wherein the device is an optical device which uses at least optical transmission characteristics of the relaxor ferroelectric solid solution single crystal.

6. The device according to claim 5, wherein the optical device is an optical memory or light valve.

7. The device according to claim 5, wherein the device uses not only the optical transmission characteristics, but also changes in dielectric characteristics of the relaxor ferroelectric solid solution single crystal taking place with changes in the optical transmission characteristics.

* * * * *